United States Patent
Byeon et al.

(10) Patent No.: US 7,190,025 B2
(45) Date of Patent: Mar. 13, 2007

(54) ARRAY OF PULL-UP TRANSISTORS FOR HIGH VOLTAGE OUTPUT CIRCUIT

(75) Inventors: Jae-Il Byeon, Seoul (KR); Il-Hun Shon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 169 days.

(21) Appl. No.: 10/624,506

(22) Filed: Jul. 23, 2003

(65) Prior Publication Data
US 2004/0119116 A1 Jun. 24, 2004

(30) Foreign Application Priority Data
Jul. 26, 2002 (KR) .................. 10-2002-0044222

(51) Int. Cl.
*H01L 29/72* (2006.01)
(52) U.S. Cl. ............... 257/328; 257/341; 257/401; 257/390
(58) Field of Classification Search ........... 257/390, 257/391, 392, 396, 343, 328, 341, 401
See application file for complete search history.

(56) References Cited
U.S. PATENT DOCUMENTS

| | | | | |
|---|---|---|---|---|
| 5,126,911 A | * | 6/1992 | Contiero et al. | 361/84 |
| 5,485,027 A | * | 1/1996 | Williams et al. | 257/343 |
| 6,331,794 B1 | * | 12/2001 | Blanchard | 327/112 |

* cited by examiner

Primary Examiner—Edward Wojciechowicz
(74) Attorney, Agent, or Firm—Volentine & Whitt, P.L.L.C.

(57) ABSTRACT

A pull-up transistor array for a high voltage output circuit is provided. The transistor array includes a semiconductor substrate, an epitaxial layer formed on the semiconductor substrate and N double diffused MOS transistors (DMOS transistors) laterally arranged on the epitaxial layer. One of source/drains of the DMOS transistors is formed at each of transistors, and the N DMOS transistors share another source/drain. Accordingly, the pull-up transistor array may output a signal of a high voltage and high current, and may high-integrate a device because a device isolation region is not required between the DMOS transistors.

21 Claims, 7 Drawing Sheets

ARRAY OF PULL-UP TRANSISTORS FOR HIGH VOLTAGE OUTPUT CIRCUIT

CROSS REFERENCES TO RELATED APPLICATIONS

This application claims priority under 35 U.S.C. § 119 from Korean Patent Application No. 2002-0044222, filed on Jul. 26, 2002, the contents of which are hereby incorporated by reference in their entirety for all purposes as if fully set forth herein.

BACKGROUND AND SUMMARY

1. Technical Field

The present invention relates to a high voltage output circuit of a semiconductor device. More particularly, the present invention is directed to a pull-up transistor array for a high voltage output circuit.

2. Description

A semiconductor device has an output circuit for receiving a signal from external parts or other circuits in the device to output a signal of a predetermined level. The output circuit includes a level shift circuit and pull-down and pull-up transistors. In the level shift circuit, the signal inputted to the output circuit is shifted to a predetermined voltage level. The pull-up and pull-down transistors receive an outputted signal from the level shift circuit to output a low level voltage VSS or a high level voltage VDD, respectively.

FIG. 1 is a view of a conventional output circuit with PMOS pull-up and NMOS pull-down transistors.

Referring to FIG. 1, a semiconductor device has an output circuit for receiving signals to output a voltage having a predetermined level. Each signal inputted to an input port IN n is inputted to a level shift circuit L/S n. Next, the signal is shifted to a voltage having a predetermined level to be inputted to the gate electrodes of pull-up and pull-down transistors 2 and 4. The high level voltage VDD is supplied to the source of the PMOS pull-up transistor 2 and the low level voltage VSS is supplied to the source of the NMOS pull-down transistor 4. The drain of the pull-up transistor 2 and the drain of the pull-down transistor 4 are connected to an output port OUP n to output the predetermined voltage level.

If a pull-up signal is outputted from the level shift L/S n, the pull-down transistor 4 is turned off and the pull-up transistor 2 is turned on. Thus, the output circuit outputs the high level voltage VDD. On the other hand, if a pull-down signal is outputted from the level shift L/S n, the pull-up transistor 2 is turned off and the pull-down transistor 4 is turned on. Thus, the output circuit outputs the low level voltage VSS.

FIG. 2 is a view of a conventional output circuit having the NMOS pull-up and NMOS pull-down transistors.

The output circuit of FIG. 2 has an NMOS pull-up transistor. Unlike the output circuit of FIG. 1 having the PMOS pull-up transistor, the output circuit of FIG. 2 having the NMOS pull-up transistor requires an additional circuit for inputting the pull-up and pull-down signals to the pull-up and pull-down transistors, respectively. However, in the case of the output circuit having the NMOS pull-up transistor, the area of the transistor is small and layout is easily achieved as compared with the output circuit having the PMOS pull-up transistor.

Referring to FIG. 2, each signal inputted into the input port IN n is inputted to the level shift circuit L/S n to be shifted to the predetermined voltage level. Next, like the output circuit having the PMOS pull-up transistor, the shifted signal is inputted to the gate electrode of the NMOS pull-up and NMOS pull-down transistors 6 and 8.

The high level voltage VDD is supplied to the drain of the NMOS pull-up transistor 6 and the low level voltage VSS is supplied to the source of the NMOS pull-down transistor 8. The source of the pull-up transistor 6 and the drain of the pull-down transistor 8 are connected to the output port OUT n to output the predetermined voltage level.

If the pull-up signal is outputted from the level shift L/S n, the pull-down transistor 8 is turned off and the pull-up transistor 6 is turned on. Thus, the output circuit outputs the high level voltage VDD. On the other hand, if the pull-down signal is outputted from the level shift L/S n, the pull-up transistor 6 is turned off and the pull-down transistor 8 is turned on. Thus, the output circuit outputs the low level voltage VSS.

FIG. 3 is a top plan view of the pull-up and pull-down transistor arrays for the output circuit having a conventional PMOS pull-up transistor.

Referring to FIG. 3, an N-well region 12 and a P-well region 10 are widely defined at the semiconductor substrate. PMOS transistors 16 are disposed at the N-well region 12 and NMOS transistors 14 are disposed at the P-well region 10. Typically, transistors having a same channel are disposed adjacent to one another in order to form easily a conductive well.

Although not shown in the figure, the source and drain of the transistors and the gate electrode are connected to an interconnection to constitute the output circuit. A gate electrode 18 of the NMOS transistor 14 and a gate electrode 20 of the PMOS transistor are connected to the level shift circuit. The high level voltage is supplied to a source 26 of the PMOS transistor 16 through the interconnection. The low level voltage is supplied to a source 22 of the NMOS transistor 14 through the interconnection. Also, a drain 28 of the PMOS transistor 16 and a drain 24 of the NMOS transistor 14 are opposite to each other, and are coupled to each other as well as to the output port through the interconnection.

As illustrated in FIG. 3, because a typical semiconductor device operates at an external input voltage of 5V or less, the pull-up and pull-down transistors have a general MOS transistor structure at the output circuit of the semiconductor device. However, the pull-up and pull-down transistors having the general MOS transistor structure cannot be used in the semiconductor device requiring a high voltage operation circuit such as a power device. This is because the pull-up and pull-down transistors cannot resist high voltage and current. Thus, the semiconductor device requiring the high voltage operation circuit includes a double diffused transistor (DMOS transistor) that is operable at the high voltage.

Accordingly, it would be advantageous to provide a pull-up transistor array for a high voltage output circuit in a semiconductor device where a high voltage operation is needed.

It would also be advantageous is to reduce an area of a pull-up transistor array by removing a device isolation region for isolation between transistors.

According to one aspect, the present invention provides a pull-up transistor array having double diffused transistors. The transistor array includes a semiconductor substrate, an epitaxial layer formed on the semiconductor substrate and N double diffused MOS transistors (DMOS transistors) laterally arranged on the epitaxial layer. One of source/drains of the double diffused transistors is formed at each of the transistors, and the N double diffused MOS transistors share another source/drain.

In accordance with another aspect of the present invention, the DMOS transistor may be a vertical double diffused MOS transistor (VDMOS transistor). The pull-up transistor array includes a substrate of a first conductivity type and an epitaxial layer of a second conductivity type formed on the substrate. A buried layer of the second conductivity type is interposed between the substrate and the epitaxial layer. A plurality of looped insulating patterns is regularly spaced and arranged on the epitaxial layer in one direction. A gate pattern is formed over the epitaxial layer surrounded by the looped insulating patterns. The gate pattern partially overlaps on an upper portion of the looped insulating pattern. Also, the gate pattern has a mesh-shaped structure in which a plurality of openings is arranged two-dimensionally. A plurality of source regions is formed in the epitaxial layer exposed through the openings of the gate pattern. A drain region is formed in the epitaxial layer between the looped insulating patterns. The drain region is aligned to outer walls of the looped insulating patterns to be formed vertically in the epitaxial layer.

In accordance with another aspect of the present invention, the DMOS transistor may be a lateral double diffused MOS transistor (LDMOS transistor). The pull-up transistor array having a P-channel LDMOS transistor includes a substrate of a first conductivity type, an epitaxial layer of a second conductivity type formed on the substrate, and a plurality of first conductivity type wells formed in the epitaxial layer. The first conductivity type wells are regularly spaced and arranged in one direction. A second conductivity type well is formed in the epitaxial layer surrounding the first conductivity type wells. The second conductivity type wells have a ladder-shaped structure aligned to sidewalls of the first conductivity type wells. Looped gate patterns are formed on the epitaxial layer. The looped gate patterns overlap on the upper portion of the sidewalls of the first conductive wells. A looped insulating pattern is interposed between the epitaxial layer and the gate patterns. A source region is aligned to outer sidewalls of the looped insulating patterns to be formed in the second conductivity type well. A plurality of drain regions is aligned to inner sidewalls of the looped insulating patterns to be formed in the first conductivity type wells, respectively.

DETAILED DESCRIPTION

Figure 1:
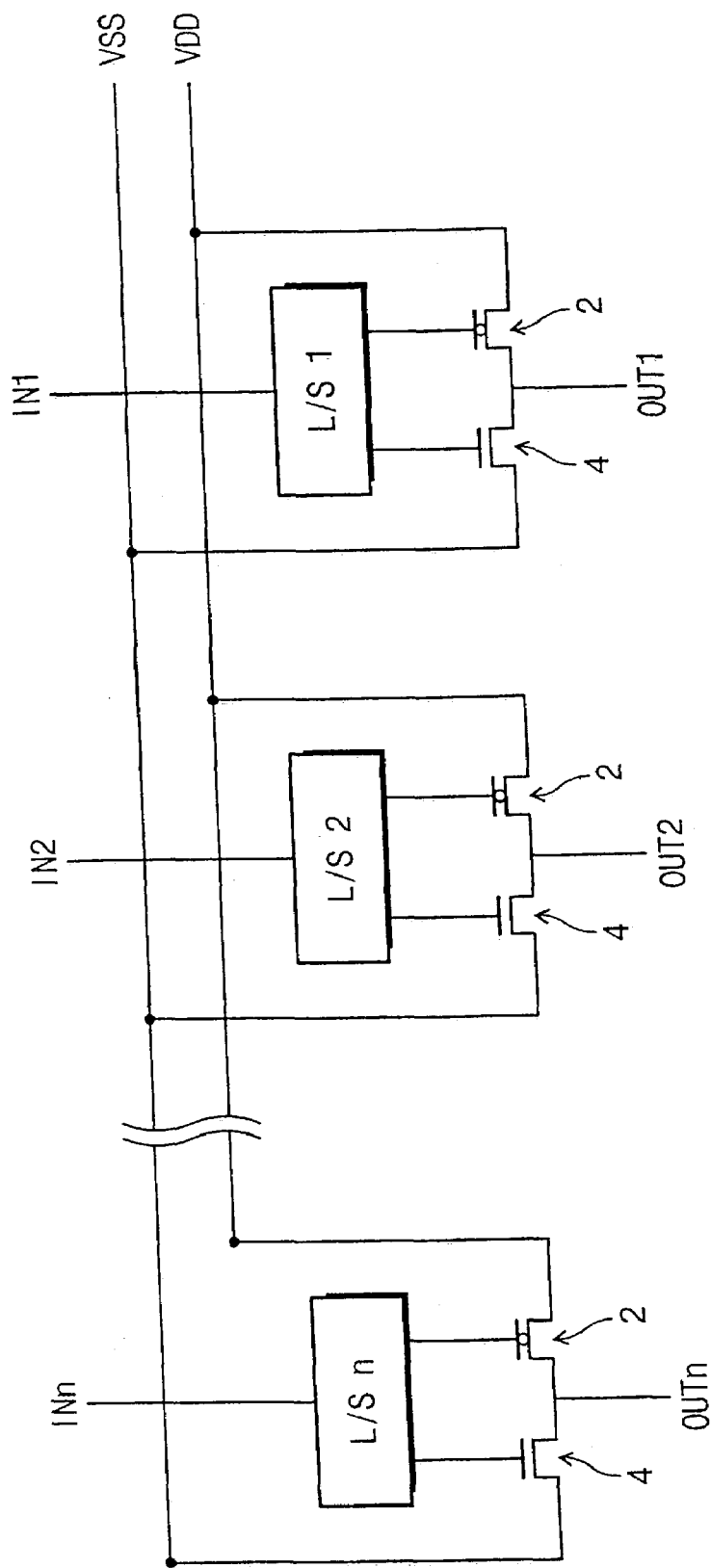
FIG. 1 is a view of a conventional output circuit with PMOS pull-up and NMOS pull-down transistors.
Figure 2:
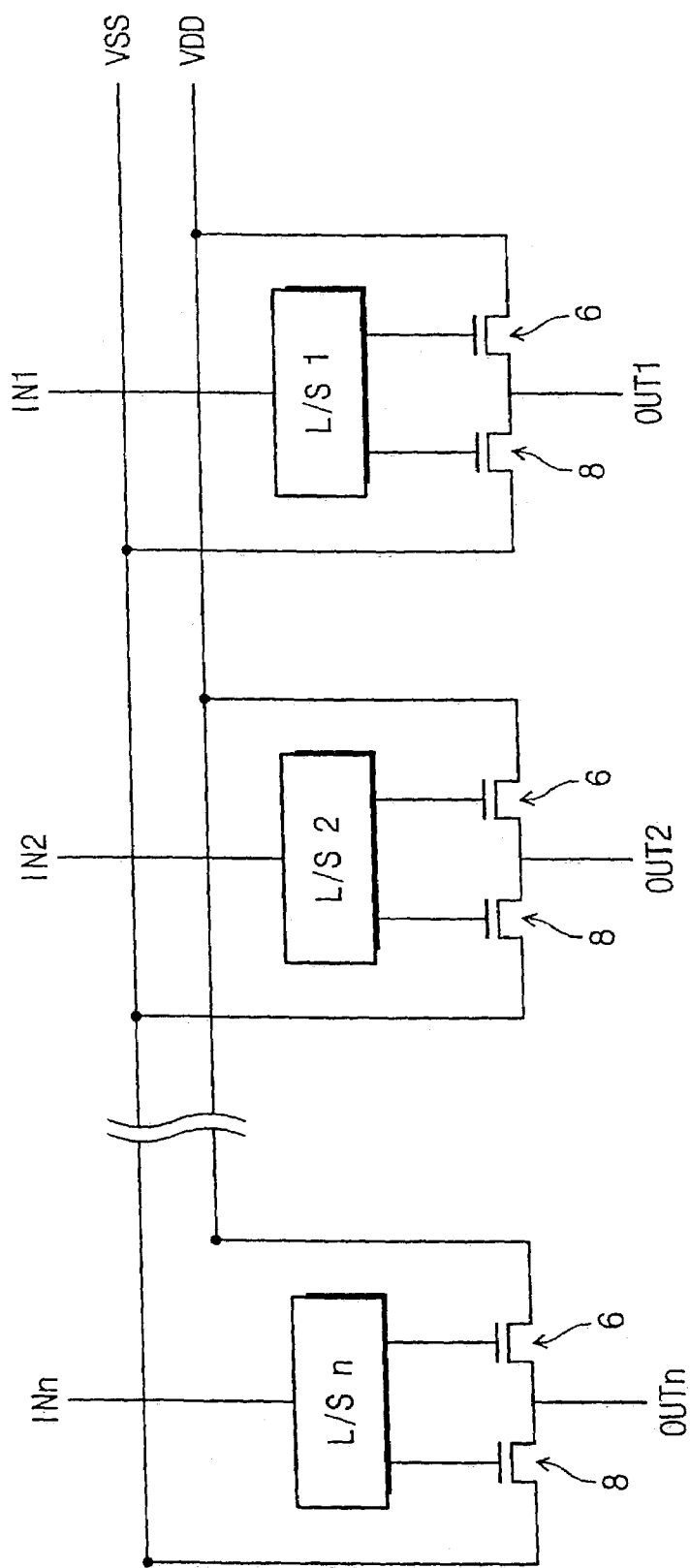
FIG. 2 is a view of a conventional output circuit with NMOS pull-up and NMOS pull-down transistors.
Figure 3:
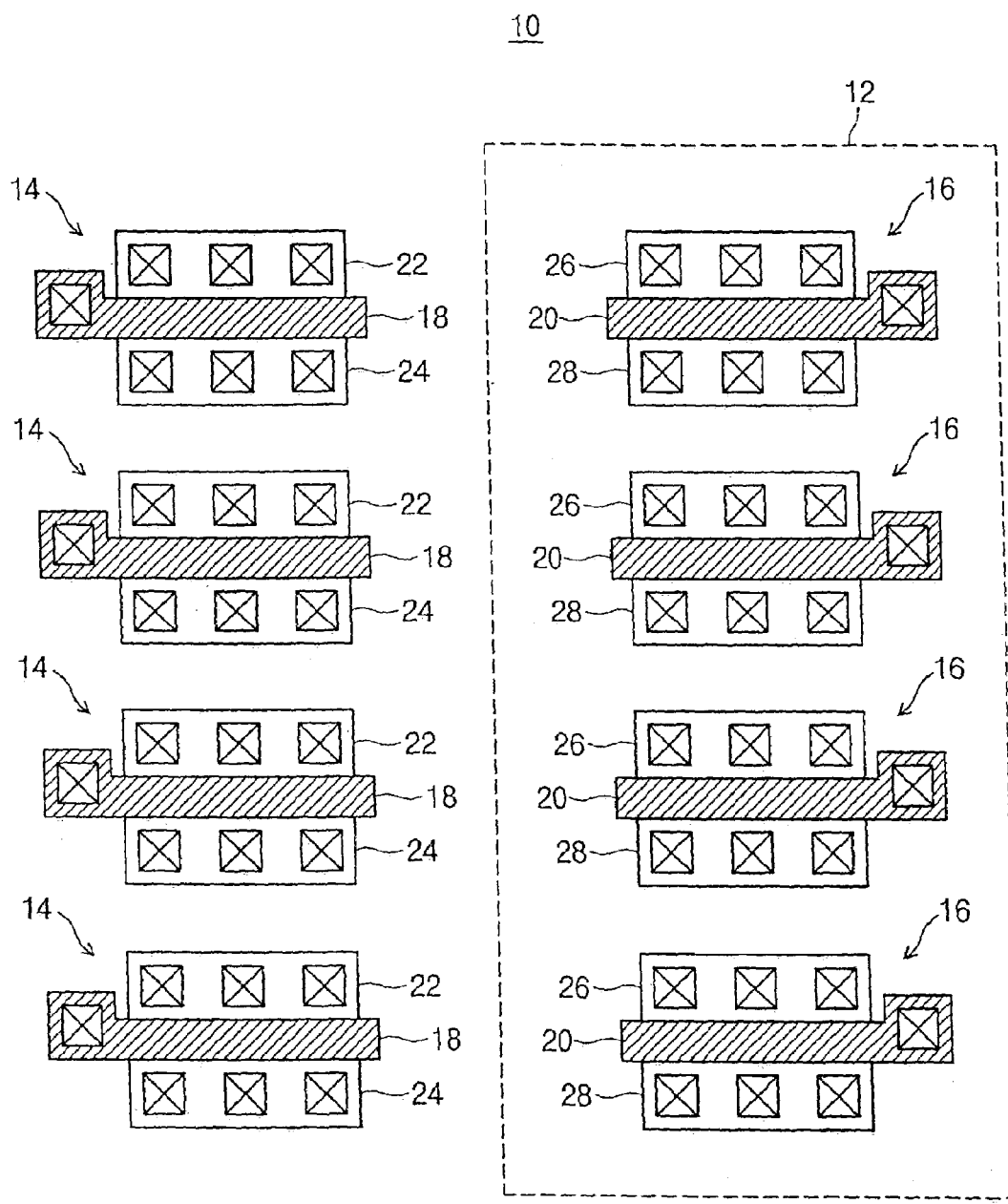
FIG. 3 is a top plan view for showing pull-up and pull-down transistor arrays for the output circuit having a conventional NMOS pull-up transistor.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 4:
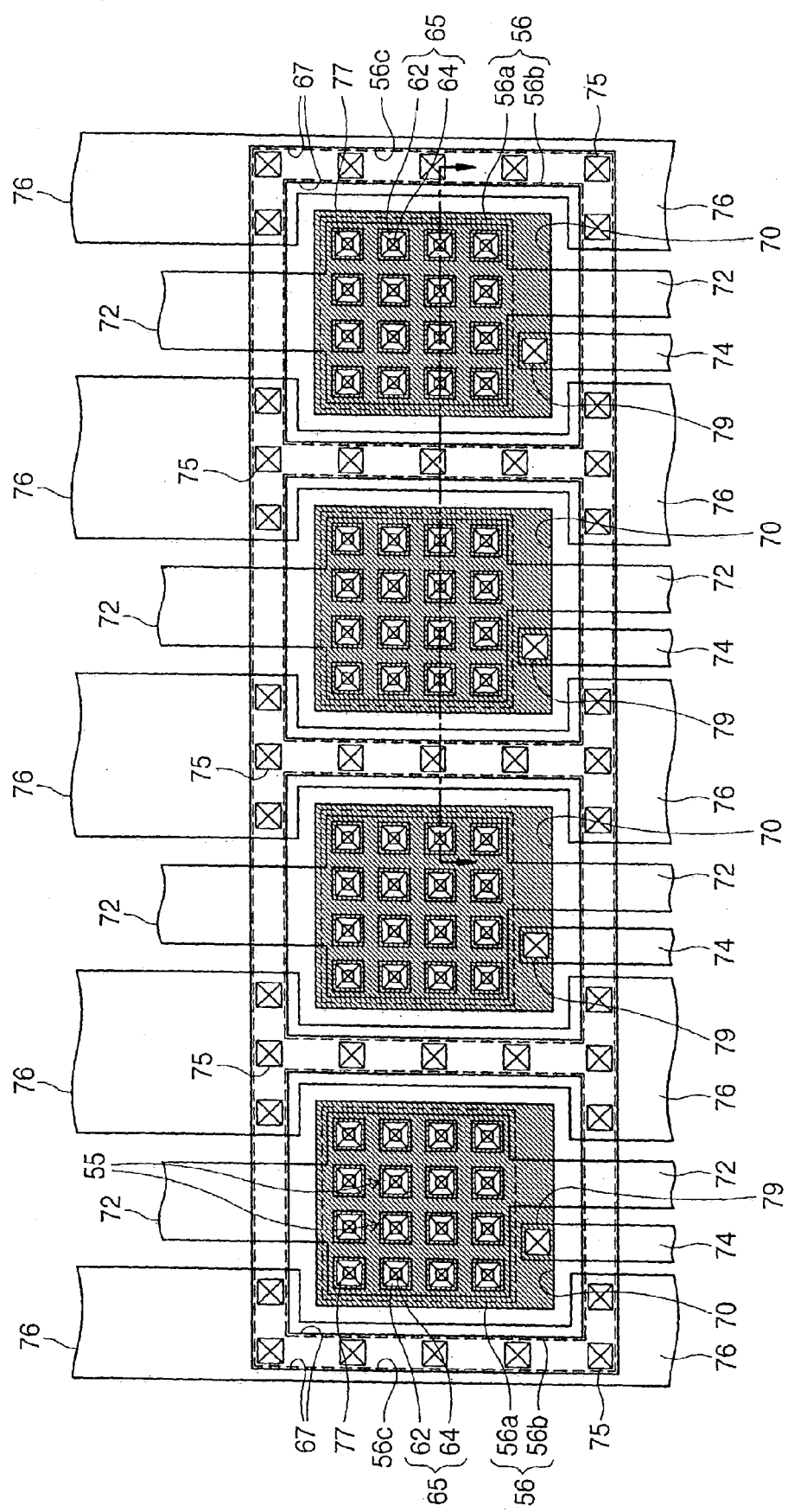
FIG. 4 is a top plan view for illustrating a pull-up transistor array according to a first embodiment.

FIG. 4 is a top plan view for illustrating a pull-up transistor array according to a first embodiment.

Figure 5:
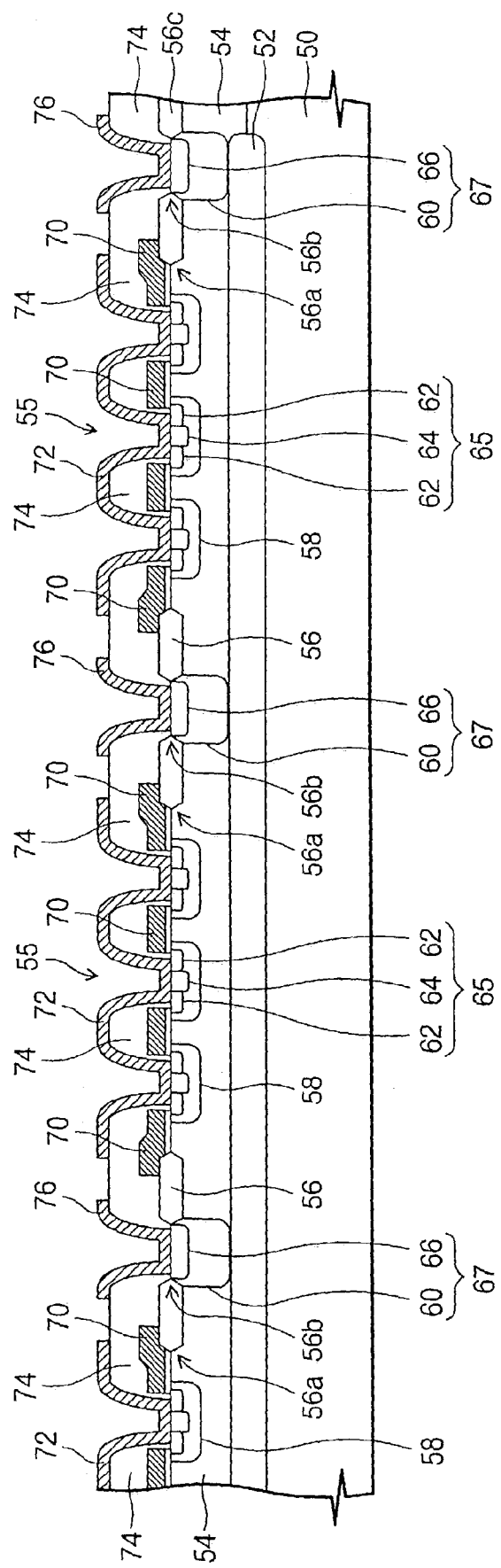
FIG. 5 is a cross-sectional view for illustrating the pull-up transistor array of FIG. 4, taken along a line I–I'.

FIG. 5 is a cross-sectional view for illustrating the pull-up transistor array of FIG. 4, taken along a line I–I' of FIG. 4.

Referring to FIGS. 4 and 5, the pull-up transistor array includes N-channel vertical double diffused MOS transistors (VDMOS transistors). The pull-up transistor array has an N-type epitaxial layer 54 formed on a P-type substrate 50. An N-type buried layer 52 is interposed between the P-type substrate 50 and the N-type epitaxial layer 54. The N-type buried layer 52 is a more heavily doped impurity diffusion layer than the N-type epitaxial layer 54. A plurality of looped insulating patterns 56 are arranged on the N-type epitaxial layer 54, regularly spaced in one direction. A gate pattern 70 is formed on the N-type epitaxial layer 54 surrounded by the looped insulating pattern 56. The gate pattern 70 partially overlaps an upper portion of the N-type epitaxial layer 54. Thus, an inner sidewall 56a of the looped insulating pattern 56 is positioned beneath the gate pattern 70. The gate pattern 70 has a mesh-shaped structure in which a plurality of openings 55 are arranged two-dimensionally in row and column directions.

A P-type body region 58 is formed in the N-type epitaxial layer 54 exposed through each opening 55 of the gate pattern 70. The P-type body region 58 is partially and laterally diffused up to the N-type epitaxial layer 54 under the gate pattern 70. An N-type heavily doped source layer 62 is formed in the P-type body region 58. The N-type heavily doped source layer 62 is formed on a surface of the P-type body region 58 exposed through the opening 55. A P-type pickup layer 64 is adjacent to the N-type heavily doped source layer 62 to be formed in the P-type body region 58 exposed through the opening 55. While a transistor operates, the P-type pickup layer 64 prevents the N-type heavily doped source layer 62, the P-type body region 58 and the N-type epitaxial layer 54 from acting as a parasitic bipolar transistor. As illustrated, under the gate pattern 70, the N-type heavily doped source layer 62 and the N-type epitaxial layer 54 are isolated at a predetermined distance to define a channel of the transistor. The P-type body region 58, the P-type pickup layer 64 and the N-type heavily doped source layer 62 constitute a source region 65 of the transistor. Thus, a plurality of source regions 65 are arranged two-dimensionally adjacent to one gate pattern 70.

An N-type drift layer 60 is formed in the N-type epitaxial layer 54, aligned to an outer sidewall 56b of the looped insulating patterns 56. The N-type drift layer 60 is vertically formed in the N-type epitaxial layer 54 to connect to the N-type buried layer 52. An N-type heavily doped drain layer 66 is formed in the N-type drift layer 60. The N-type drift layer 60 and the N-type heavily doped drain layer 66 constitute a drain region 67. The pull-up transistor is a vertical double diffused metal oxide silicon transistor (VDMOS transistor) including the gate pattern 70 of the mesh-shaped structure, the source region 65 and the drain region 67. Each VDMOS transistor includes a source region. In the pull-up transistor array, a plurality of the VDMOS transistors shares one drain region. For example, all VDMOS transistors constituting the pull-up transistor array may share one drain region, or a predetermined number of VDMOS transistors may share one drain region.

The gate electrodes 74 are connected to the gate patterns 70, respectively. A source electrode 72 is connected to the source regions 65, which are arranged two-dimensionally and surrounded by the gate pattern 70. The source electrodes 72 are disposed on the gate patterns 70, respectively. A plurality of drain electrodes 76 is connected to the drain region 67. For example, the drain electrodes 76 may be connected to the drain regions 67 between a pair of the adjacent looped insulating patterns 56, respectively. Although not shown in the figures, in one direction, the source electrode 72 is connected to a drain electrode of a pull-down transistor formed at another region of the semiconductor substrate. In another direction, a source electrode 72 is connected to a high voltage output port. Also, a high level power is supplied to the drain electrode 76 into which a high level voltage is applied. Lastly, the gate electrode 74 is connected to a level shift circuit. The gate electrode 74, the drain electrode 76 and the source electrode 72 are connected to the gate pattern 70, the drain region 67 and the source region 65, respectively, through a gate contact hole 79, a drain contact hole 77 and a source contact hole 75, respectively. The gate electrode 74 may be connected to the gate pattern 70 directly, or through a contact plug filling to the gate contact hole 79. Also, the drain electrode 76 and the source electrode 72 are connected the same as the gate electrode 74.

According to the first embodiment, since the pull-up transistor array has the VDMOS transistors, a high voltage may be outputted. Typically, because the DMOS transistors operate at the high voltage, they need a wide device isolation region so as to electrically isolate them from adjacent transistors. However, as described herein, the DMOS transistors constituting the pull-up transistor array share drain regions into which the high level voltage is applied. Accordingly, a device isolation layer is not required between the transistors. As a result, it is possible to enhance an integration level of the devices.

Figure 6:
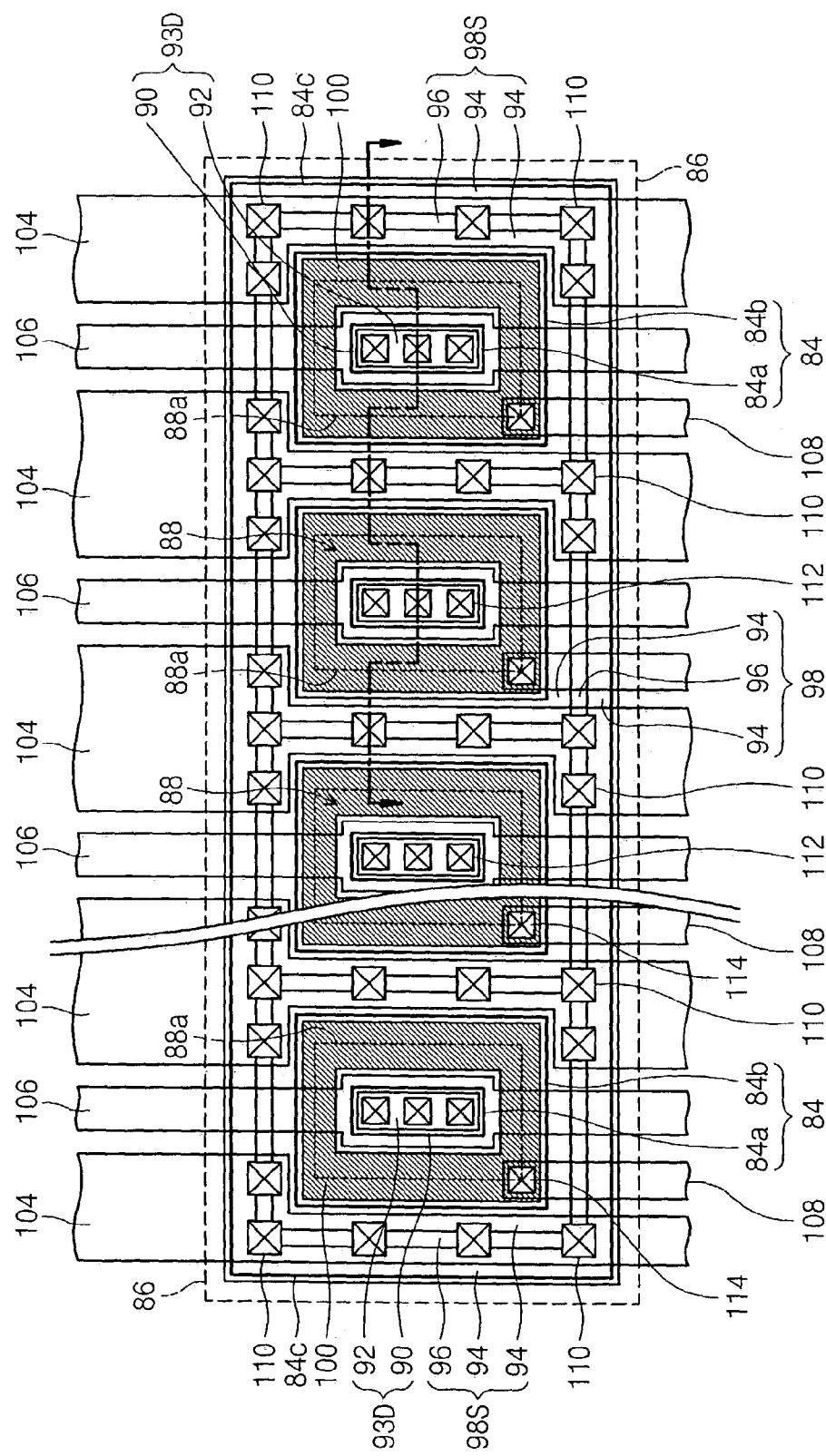
FIG. 6 is a top plan view for illustrating the pull-up transistor array according to a second embodiment.

FIG. 6 is a top plan view of the pull-up transistor array according to a second embodiment.

Figure 7:
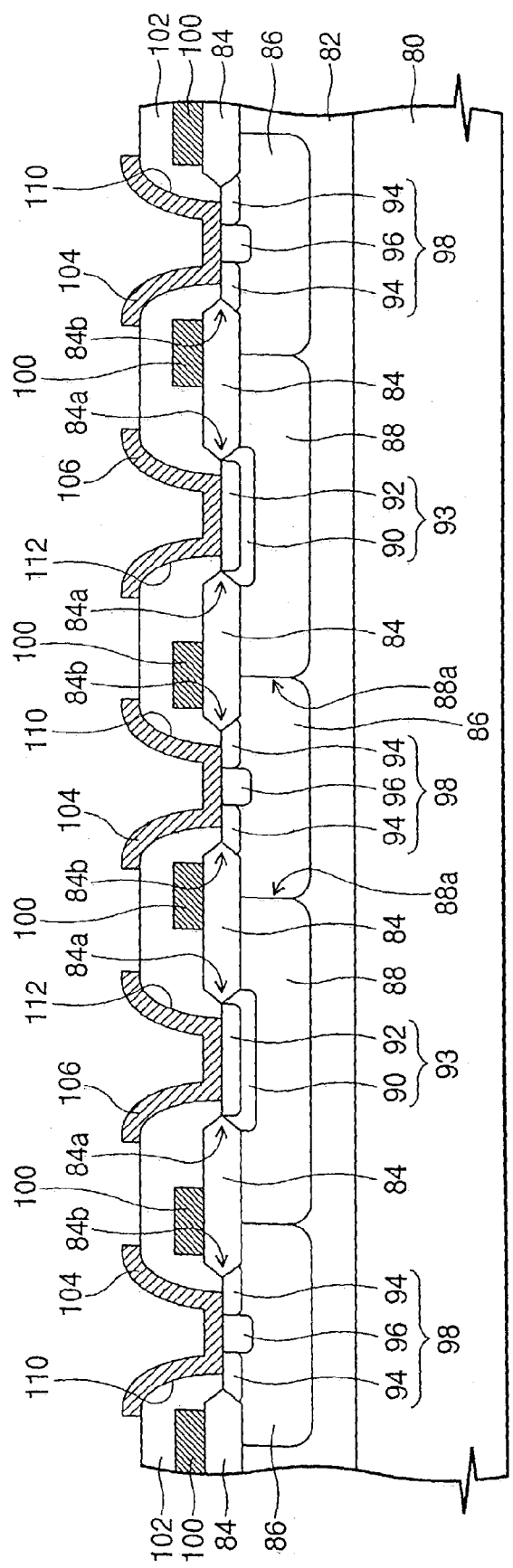
FIG. 7 is a cross-sectional view for illustrating the pull-up transistor array of FIG. 6, taken along a line II–II'.

FIG. 7 is a cross-sectional view of the pull-up transistor array of FIG. 6 taken along a line II–II'.

Referring to FIGS. 6 and 7, the pull-up transistor array according to the second embodiment has P-type lateral double diffused MOS transistors (LDMOS transistor). Like the foregoing first embodiment, the device isolation region is not formed between the LDMOS transistors constituting the pull-up transistor array. Thus, an area of the pull-up transistor array is reduced to increase an integration level of the semiconductor device.

The pull-up transistor array includes an N-type epitaxial layer 82 formed on a P-type substrate 80. The device isolation layer 84 is formed on the N-type epitaxial layer 82 to define a region where the pull-up transistor array is to be formed. A plurality of P-wells 88 is formed in the N-type epitaxial layer 82, regularly spaced in one direction. An N-well 86 of a ladder-shaped structure aligned to sidewalls 88A of the P-wells is formed in the N-type epitaxial layer 82.

The N-well 86 surrounds the P-wells 88. A plurality of looped gate patterns 100 is formed on the N-type epitaxial layer 82. Each of the looped gate patterns 100 overlaps on the upper portion of the sidewalls 88A of the P-wells. That is, the sidewalls 88A of the P-well are positioned under the looped gate patterns 100. A looped insulating pattern 84 is interposed between the looped gate pattern 100 and the N-type epitaxial layer 82. Like the looped gate pattern 100, the looped insulating patterns 84 overlap on the upper portion of the sidewalls 88A of the P-well. Thus, an outer sidewall 84B of the looped insulating pattern is positioned on the N-well 86, and an inner sidewall 84A of the looped insulating pattern is positioned on the P-well 88.

A drain region 93 is formed in each P-well 88, surrounded by the looped insulating pattern 84. The drain region 93 is aligned to the inner sidewall 84A of the looped insulating pattern to include a P-type body region 90 and a P-type heavily doped drain layer 92. The P-type body region 90 is formed in the P-well 88 and the P-type heavily doped drain region 92 is formed at a surface of the epitaxial layer 82 in the P-type body region 90.

A source region 98 is formed in the N-well 86 between the looped insulating patterns 84. The source region 98 includes a P-type heavily doped source layer 94 and a N-type pickup region 96 adjacent to the P-type heavily doped source layer 94. As illustrated, the P-type heavily doped source layer 94 is formed around the looped insulating patterns 84 and the device isolation layer 84C. The N-type pickup region 96 is formed between the P-type heavily doped source layers 94.

Gate electrodes 108 are respectively connected to the gate patterns 100, and a drain electrode 106 is correspondingly connected to each drain region 93. A plurality of source electrodes 104 is connected to the source region 98. For example, the source electrodes 104 may be connected to the source regions 98 between a pair of the adjacent looped insulating patterns 84, respectively. Each source electrode 104 is connected to the P-type heavily doped source layer 94 and the N-type pickup region 96. Although not shown in the figure, a pull-down transistor array is formed at another region of the semiconductor substrate. The drain electrodes 106 are respectively connected to the drain electrodes of the pull-down transistors formed at another region of the semiconductor device in one direction, and are connected to the high voltage output port in another direction. Further, the high level power is supplied to the source electrodes 104 into which the high level voltage is applied. Lastly, the gate electrode 108 is connected to the level shift circuit. The gate electrode 108, the drain electrode 106 and the source electrode 104 are respectively connected to the gate pattern 100, the drain region 93 and the source region 98 through a gate contact hole 114, a drain contact hole 112 and a source contact hole 110, respectively, which are formed on an interlayer dielectric layer 102. As illustrated, the source electrode 104 and the drain electrode 106 are directly connected to the source region 98 and the drain region 93, respectively. Also, the gate electrode 108 is connected the same as the source electrode 104 and the drain electrode 106. On the other hand, the source electrode 104, the drain electrode 106 and the gate electrode 108 may be respectively connected to contact plugs.

According to the second embodiment, since the pull-up transistor array has the LDMOS transistors, a high voltage may be outputted. In addition, in similarity to foregoing first embodiment, the DMOS transistors constituting the pull-up transistor array share the source regions into which the high level voltage is applied. Accordingly, the device isolation layer is not required between the transistors. Therefore, it is possible to enhance an integration level of the device.

According to the present invention, the pull-up transistors are formed using the DMOS transistors. Accordingly, a signal of the high voltage and high current may be inputted and outputted. When the pull-up transistor array is constituted, a plurality of the transistors share a region connected to the high level signal such that the device isolation region is not required between the DMOS transistors. Thus, the area of the pull-up transistor array can be reduced.

As a result, according to the present invention, the signal of the high voltage and high current may be inputted and outputted. Also, since the area of the semiconductor device is reduced, the high integration device may be fabricated.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A pull-up transistor array for a high voltage output circuit comprising:
   a semiconductor substrate;
   an epitaxial layer disposed on the semiconductor substrate;
   N double diffused MOS transistors (DMOS transistor) laterally arranged in the epitaxial layer, each DMOS transistor having a source and a drain, wherein one of the source and drain surrounds the other of the source and drain, wherein one of the source or drain of each double diffused MOS transistor is formed unique to each transistor, and wherein the N DMOS transistors share in common the other of the source or drain;
   at least one electrode for the one of the source or drain commonly shared among the N DMOS transistors; and
   at least one unique electrode for the one of the source or drain of each of the double diffused MOS transistors that is formed unique to each of the DMOS transistors.

2. The pull-up transistor array for the high voltage output circuit as claimed in claim 1, wherein the DMOS transistor is an N-type vertical double diffused MOS transistor (nVDMOS transistor).

3. The pull-up transistor array for the high voltage output circuit as claimed in claim 1, wherein the DMOS transistor is a P-type lateral double diffused MOS transistor (pLDMOS transistor).

4. A pull-up transistor array for a high voltage output circuit comprising:
   a substrate of a first conductivity type;
   an epitaxial layer of a second conductivity type disposed on the substrate;
   a buried layer of the second conductivity type interposed between the substrate and the epitaxial layer;
   a plurality of looped insulating patterns regularly spaced and disposed on the epitaxial layer along one direction;
   a gate pattern disposed on an upper part of a region surrounded by the looped insulating pattern such that the gate pattern partially overlaps an upper portion of the looped insulating layer, and having a mesh-shaped structure in which with a plurality of openings are arranged two-dimensionally exposing the epitaxial layer;
   a drain region aligned to outer walls of the looped insulating patterns to be disposed vertically in the epitaxial layer between the looped insulating patterns; and
   a plurality of source regions disposed respectively in the epitaxial layer exposed through the openings of the gate patterns.

5. The pull-up transistor array as claimed in claim 4, wherein the drain region comprises:
   a drift layer of the second conductivity type vertically connected to the buried layer of the second conductivity type; and
   a heavily doped drain layer of the second conductivity type disposed in the drift layer of the second conductivity type.

6. The pull-up transistor array as claimed in claim 4, wherein each source region comprises:
   a body region of the first conductivity type disposed in the epitaxial layer of each opening;
   a heavily doped source layer of the second conductivity type disposed in an upper portion of the epitaxial layer in the body region of the first conductivity type; and
   a pickup region of the first conductivity type disposed adjacent to the heavily doped source layer disposed in an upper portion of the epitaxial layer of the body region,
   wherein the body region is laterally diffused from the heavily doped source layer of the second conductivity type by a fixed distance.

7. The pull-up transistor array as claimed in claim 4, further comprising source electrodes disposed on the gate pattern to output a high voltage, wherein each source electrode is connected in common to the source regions formed in the openings of the gate pattern.

8. The pull-up transistor array as claimed in claim 4, further comprising a plurality of drain electrodes connected to the drain region, wherein the high voltage is supplied to the drain electrodes.

9. The pull-up transistor array as claimed in claim 4, further comprising gate electrodes connected to the gate patterns to input a pull-up signal, respectively.

10. A pull-up transistor array for a high voltage output circuit, comprising:
    a substrate of a first conductivity type;
    an epitaxial layer of a second conductivity type disposed on the substrate;
    a plurality of the first conductivity type wells regularly spaced and disposed in the epitaxial layer along one direction;
    a second conductivity type well of a ladder shaped structure aligned to sidewalls of the first conductivity type wells, disposed in the epitaxial layer surrounding the first conductivity type wells;
    looped gate patterns respectively disposed on the epitaxial layer, wherein the looped gate patterns overlap an upper portion of sidewalls of the first conductivity type well;
    a looped insulating pattern interposed between the epitaxial layer and the looped gate patterns;
    a source region aligned to outer walls of the looped insulating patterns, disposed in the second conductivity type well; and
    a plurality of drain regions aligned to inner walls of the looped insulating patterns, respectively disposed in the first conductivity type well.

11. The pull-up transistor array as claimed in claim 10, wherein the source region comprises:
    a heavily doped diffusion layer of the first conductivity type formed in an upper portion of the epitaxial layer in the second conductivity type well; and
    a pickup region of the second conductivity type, wherein the source layer of the first conductivity type surrounds the pickup region of the second conductivity type.

12. The pull-up transistor array for the high voltage output circuit as claimed in claim 10, wherein each drain region comprises:
a body region of the first conductivity type aligned to an inner wall of a corresponding looped insulating pattern to be formed in the first conductivity type well; and
a heavily doped drain layer of the first conductivity type formed in an upper portion of the epitaxial layer in the body region of the first conductivity type.

13. The pull-up transistor array as claimed in claim 10, further comprising drain electrodes connected to the drain regions to output a high voltage, respectively.

14. The pull-up transistor array as claimed in claim 10, further comprising a plurality of source electrodes connected to the source, region into which the high voltage is applied.

15. The pull-up transistor array for the high voltage output circuit as claimed in claim 10, further comprising a plurality of gate electrodes respectively connected to the gate pattern to input individually a plurality of pull-up signals.

16. The pull-up transistor array of claim 1, wherein the one of the source or drain commonly shared among the N DMOS transistors surrounds the one of the source or drain of each double diffused MOS transistor formed unique to each transistor.

17. The pull-up transistor array of claim 1, where the common electrode and unique electrodes are all disposed on a same side of the semiconductor substrate as each other.

18. The pull-up transistor array of claim 1, where the epitaxial layer is of a first conductivity type and the source and drain are of a second conductivity type different from the first conductivity type.

19. The pull-up transistor array of claim 1, where the epitaxial layer is of a first conductivity type, the source and drain are of the first conductivity type, and the substrate is of a second conductivity type different from the first conductivity type.

20. The pull-up transistor array of claim 1, further comprising a buried layer interposed between the substrate and the epitaxial layer, where the epitaxial layer and the buried layer each have a first conductivity type, and where the buried layer is more heavily doped than the epitaxial layer.

21. The pull-up transistor array of claim 1, where $N>2$.

* * * * *